(12) United States Patent
Kim et al.

(10) Patent No.: US 6,981,849 B2
(45) Date of Patent: Jan. 3, 2006

(54) ELECTRO-OSMOTIC PUMPS AND MICRO-CHANNELS

(75) Inventors: Sarah E. Kim, Portland, OR (US); R. Scott List, Beaverton, OR (US); James Maveety, San Jose, CA (US); Alan Myers, Portland, OR (US); Quat T. Vu, Santa Clara, CA (US); Ravi Prasher, Phoenix, AZ (US); Ravindranath V. Mahajan, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 133 days.

(21) Appl. No.: 10/323,084

(22) Filed: Dec. 18, 2002

(65) Prior Publication Data

US 2004/0120827 A1 Jun. 24, 2004

(51) Int. Cl.
*F04B 44/08* (2006.01)
(52) U.S. Cl. .......................... 417/50; 417/48; 361/699; 165/120
(58) Field of Classification Search .................. 417/48, 417/50, 313, 248, 244; 361/699; 165/120
See application file for complete search history.

(56) References Cited

U.S. PATENT DOCUMENTS

| | | | | |
|---|---|---|---|---|
| 5,021,924 A | * | 6/1991 | Kieda et al. ................. | 361/699 |
| 5,348,076 A | * | 9/1994 | Asakawa ..................... | 165/282 |
| 5,522,452 A | * | 6/1996 | Mizuno et al. ............. | 165/286 |
| 5,846,396 A | | 12/1998 | Zanzucchi et al. | |
| 6,052,284 A | | 4/2000 | Suga et al. | |
| 6,301,109 B1 | * | 10/2001 | Chu et al. ................... | 361/690 |
| 6,443,704 B1 | * | 9/2002 | Darabi et al. ................ | 417/50 |
| 6,533,554 B1 | * | 3/2003 | Vargo et al. ................. | 417/207 |
| 2002/0127736 A1 | | 9/2002 | Chou et al. | |
| 2002/0163781 A1 | * | 11/2002 | Bartola et al. .............. | 361/699 |
| 2003/0016498 A1 | * | 1/2003 | Kurokawa et al. .......... | 361/699 |
| 2003/0030981 A1 | * | 2/2003 | Zuo et al. ................... | 361/699 |
| 2003/0062149 A1 | | 4/2003 | Goodson et al. ........ | 165/104.11 |
| 2003/0164231 A1 | * | 9/2003 | Goodson et al. ........ | 165/104.11 |
| 2004/0013536 A1 | * | 1/2004 | Hower et al. ................ | 417/207 |

* cited by examiner

Primary Examiner—Timothy S. Thorpe
Assistant Examiner—Emmanuel Sayoc
(74) Attorney, Agent, or Firm—Trop, Pruner & Hu, P.C.

(57) ABSTRACT

The present disclosure relates generally to microelectronic technology, and more specifically, to an apparatus used for the cooling of active electronic devices utilizing electro-osmotic pumps and micro-channels.

16 Claims, 7 Drawing Sheets

US 6,981,849 B2

ELECTRO-OSMOTIC PUMPS AND MICRO-CHANNELS

BACKGROUND

1. Field

The present disclosure relates generally to microelectronic technology, and more specifically, to an apparatus used for the cooling of active electronic devices utilizing electro-osmotic pumps and micro-channels.

2. Background Information

There has been rapid development in microelectronic technology, and as a result, microelectronic components are becoming smaller, and circuitry within microelectronic components is becoming increasingly dense. With a decrease in the size of components and an increase in circuit density, heat generation typically increases. Heat dissipation is becoming more critical as the technology develops.

Various techniques may typically be used to remove or dissipate heat generated by a microelectronic component. These techniques may include passive or active solutions. One such technique, which may be classified as a passive solution, involves the use of a mass of thermally conductive material that may be alternatively referred to as a heat slug, heat sink, or heat spreader. One of the primary purposes of a heat spreader is to spread, or absorb and dissipate the heat generated by a microelectronic die. This may at least in part eliminate "hot spots," or areas with excessive heat, within the microelectronic die.

A heat sink may achieve thermal contact with a microelectronic die by use of a thermally conductive material, such as a thermal interface material (TIM) deposited between the die and the heat sink. The heat sink is often attached with the top of the microelectronic component. Sometimes the heat sink is attached to the microelectronic package and not directly on the back of the microelectronic die. Typical thermal interface materials may include, for example, thermally conductive gels, grease or solders. Typical heat sinks are constructed of thermally conductive material, such as, aluminum, electrolytically plated copper, copper alloy, or ceramic, for example.

A heat exchanger, such as, for example, a water-cooling system, is another technique, which may be classified as an active technique, may be used to dissipate heat generated by a microelectronic component. Typically, a water-cooling system transfers heat from the microelectronic component to water, which becomes hot. By flowing the water that was heated through a heat sink, the water is cooled and may be reused for further cooling. The technique is considered active because the heated water is pumped away from the microelectronic component and cooler water is pumped towards the microelectronic component.

Often a water-cooling system utilizes heat sinks to transfer heat from the component to the water. The water often runs through a series of pipes and often through the heat sinks themselves. Typically contact between the microelectronic case or package and the water is avoided, and contact between the microelectronic die and the water is often greatly avoided. These techniques, both active and passive, often attempt to dissipate heat from the entire microelectronic component, regardless of whether only a portion of the component requires heat dissipation. In addition, these techniques generally dissipate heat from the microelectronic case or package, as opposed to the microelectronic die where the heat is often produced.

BRIEF DESCRIPTION OF THE DRAWINGS

Subject matter is particularly pointed out and distinctly claimed in the concluding portions of the specification. The disclosed subject matter, however, both as to organization and the method of operation, together with objects, features and advantages thereof, may be best understood by a reference to the following detailed description when read with the accompanying drawings in which:

DETAILED DESCRIPTION

In the following detailed description, numerous details are set forth in order to provide a thorough understanding of the present disclosed subject matter. However, it will be understood by those skilled in the art that the disclosed subject matter may be practiced without these specific details. In other instances, well-known methods, procedures, components, and circuits have not been described in detail so as to not obscure the disclosed subject matter.

Figure 1:
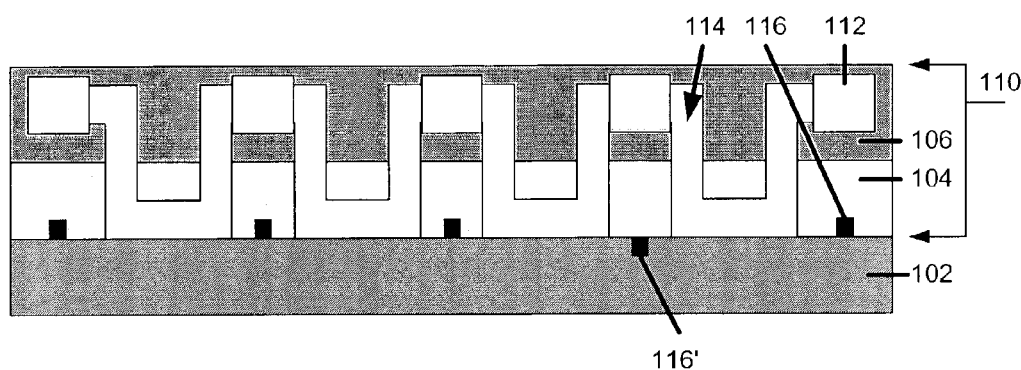
FIG. 1 is a cross sectional diagram of a microelectronic component illustrating an embodiment in accordance with the disclosed subject matter.

FIG. 1 is a cross sectional diagram of a microelectronic component illustrating an embodiment in accordance with the disclosed subject matter. FIG. 1 illustrates an embodiment that includes an active layer 102 and one cooling layer 110. It is contemplated that, in this context, when orienting terms, such as, for example, "top," "above," or "side," are used, the terms are simply for illustrative purposes and do not mean that the disclosed subject matter is fixed to a certain orientation. The disclosed subject matter is obviously not limited to the described orientation and may be, for example, turned upside down from the described embodiment.

The heat generating layer 102 may be an active layer that includes a number of active electrical devices, such as, for example, CMOS devices. However, it is contemplated that other devices may be utilized. It is also contemplated that the active electrical devices may include non-traditional heat generating devices, such as, for example, optical devices, electro-optic devices, or other devices. These active electrical devices may generate heat during operation.

The cooling layer 110 may include a micro-channel 114 that allows the passage of a fluid 115 through the microchannel, such as, for example, water. In one embodiment, the micro-channel may be anywhere from 10 nanometers to 1 millimeter wide. The micro-channel may be sufficiently sealed to allow the passage of the fluid through the micro-channel. The fluid may facilitate cooling of the active electrical devices formed within the heat generating layer 102. In one embodiment, heat may be transferred from the active electrical devices to the fluid in the micro-channels.

The cooling layer may also include a number of electro-osmotic pumps 112. It is contemplated that other types of micro-pumps may be used. Generally, an electro-osmotic pump is a device that may apply an electrical potential to a fluid. Often the electrical potential will attract ions in a fluid which are present as a result of what is known as an "electrical double layer." Hence, any excess ions will move under the applied electrical field. Because of the viscous drag, the moving ions often pull the surrounding fluid to move with the ions. This typically generates a motion in the bulk fluid. It is contemplated that the flow of a fluid may be facilitated utilizing other forms of micro-pumps and that the above is merely one non-limiting example of an electro-osmotic pump.

In one embodiment, the electro-osmotic pumps 112 may be fabricated in an operative layer 106 and micro-channel 114 may be fabricated in both the operative layer and a substrate layer 104. The operative layer 106 may be a layer in which active electrical devices may be formed. It is contemplated that other electrical devices in addition to the electro-osmotic pumps may be formed in the operative layer. Such devices may include devices that may control the electro-osmotic pumps; however, the disclosed subject matter is not limited to these devices. It is also contemplated that the micro-channels 114 may run within one layer or multiple layers of the cooling layer 110. It is further contemplated that, while the micro-channel 114 is illustrated as running in a serpentine fashion, other arrangements may be used. In one embodiment, the micro-channel may run so as to contact the heat generating layer 102. In other embodiments, the micro-channel may merely run substantially close, in at least portions, to substantially transfer heat from the active electrical devices to the fluid passing through the micro-channel. It is also contemplated that the micro-channel 114 may be formed from multiple micro-channels.

Thermal sensors 116 may sense the temperature of at least part of the heat generating layer. In one embodiment, the thermal sensor may be part of the cooling layer 110. In another embodiment, the thermal sensor(s) 116' may be part of the heat generating layer 102. The thermal sensor(s) may be capable of providing electrical signals to electro-osmotic pumps 112. These signals may facilitate turning the individual electro-osmotic pumps on or off. It is contemplated that the electro-osmotic pumps may be individually turned on or off utilizing alternate control mechanisms and the disclosed subject matter is not limited by the above illustrative example.

Figure 2:
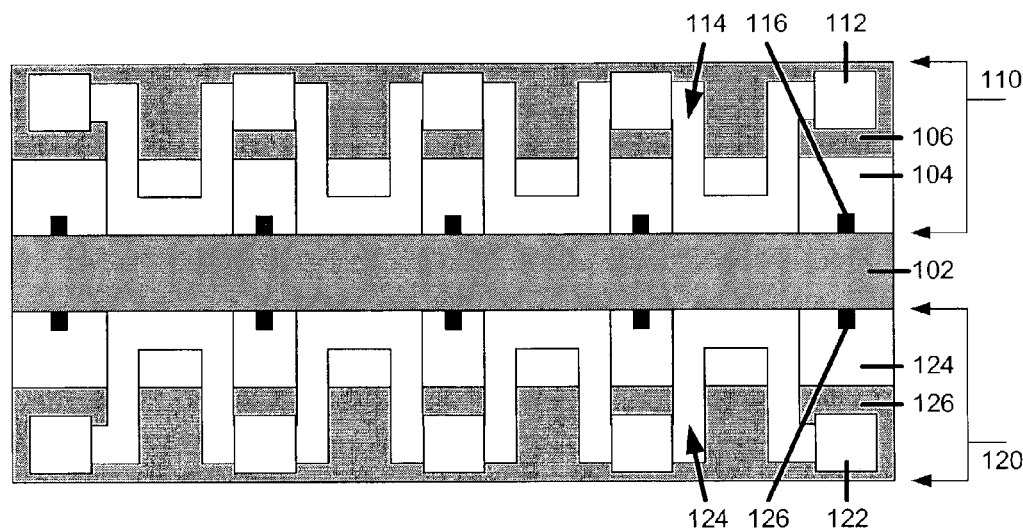
FIG. 2 is a cross sectional diagram of a microelectronic component illustrating an embodiment in accordance with the disclosed subject matter.

FIG. 2 illustrates an embodiment of disclosed subject matter in which the top surface of the heat generating layer 102 is coupled with the first cooling layer 110 and the second cooling layer 120 is coupled with the bottom of the heat generating layer. By cooling the heat generating layer from both the top and the bottom the heat generating layer may be more efficiently cooled. In one embodiment, the second cooling layer 120 may include electro-osmotic pumps 122, micro-channel 124, and thermal sensors 126. In another embodiment, the second cooling layer 120 may be formed from an operative layer 126 and a substrate 124. It is contemplated that, in one embodiment, the electro-osmotic pumps 112 & 122 may be controlled by a central control system or respective control systems (not shown).

Figure 3:
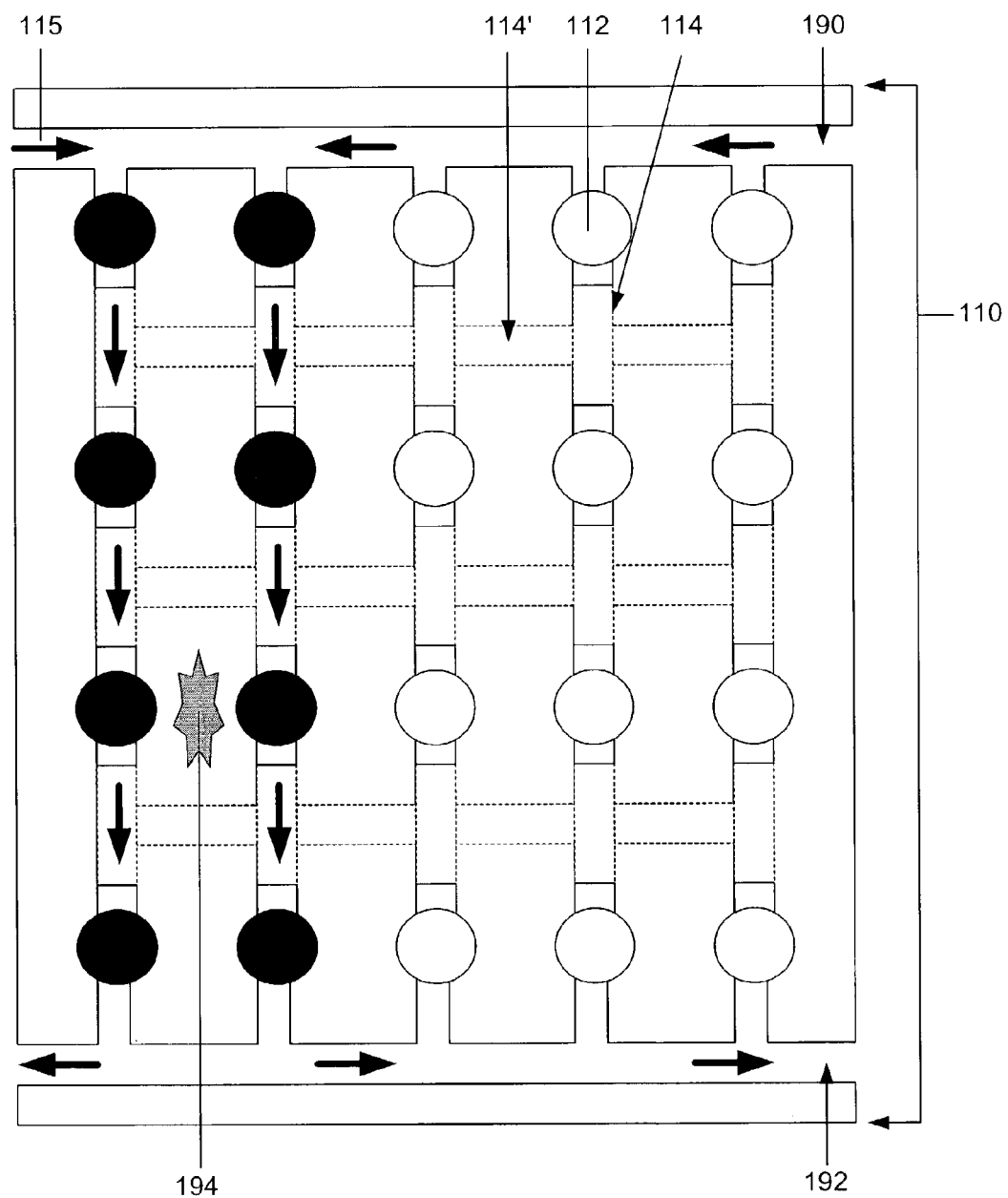
FIG. 3 is a top-down diagram of a system illustrating an embodiment in accordance with the disclosed subject matter.

FIG. 3 is a top-down diagram of a microelectronic component illustrating an embodiment in accordance with the disclosed subject matter. FIG. 3 illustrates a cooling layer 110. In one embodiment, the cooling layer may include a micro-channel 114 that has cross-channels 114'. It is contemplated that electro-osmotic pumps 112 may also intersect or regulate the flow of fluid through the cross-channels. The micro-channel may receive fluid 115 from an input port 190. It is contemplated that the fluid may be supplied from a source external to the microelectronic component or, in another embodiment, the fluid may be supplied from a different portion of the component; however, the disclosed subject matter is not limited to any source of fluid. The micro-channel may expel fluid to an output port 192. It is contemplated that the fluid may be expelled to a destination external to the microelectronic component or, in another embodiment, the fluid may be expelled to a different portion of the component; however, the disclosed subject matter is not limited to any destination of fluid.

In the embodiment illustrated by FIG. 3, a hot spot 194 may be detected. Individual electro-osmotic pumps 112 may be individually turned on (illustrated by the colour black) or turned off (illustrated by the colour white) to control the component flow (also generated illustrated by arrows 115). The flow illustrated by FIG. 3 illustrates that the pumps may be turned on in such a way as to achieve a higher flow rate than might be achieved if only one pump was turned on. It is contemplated that while FIG. 3 does not indicate substantial flow in some sections of the micro-channel 114, some insubstantial flow may occur in these channels.

Figure 4:
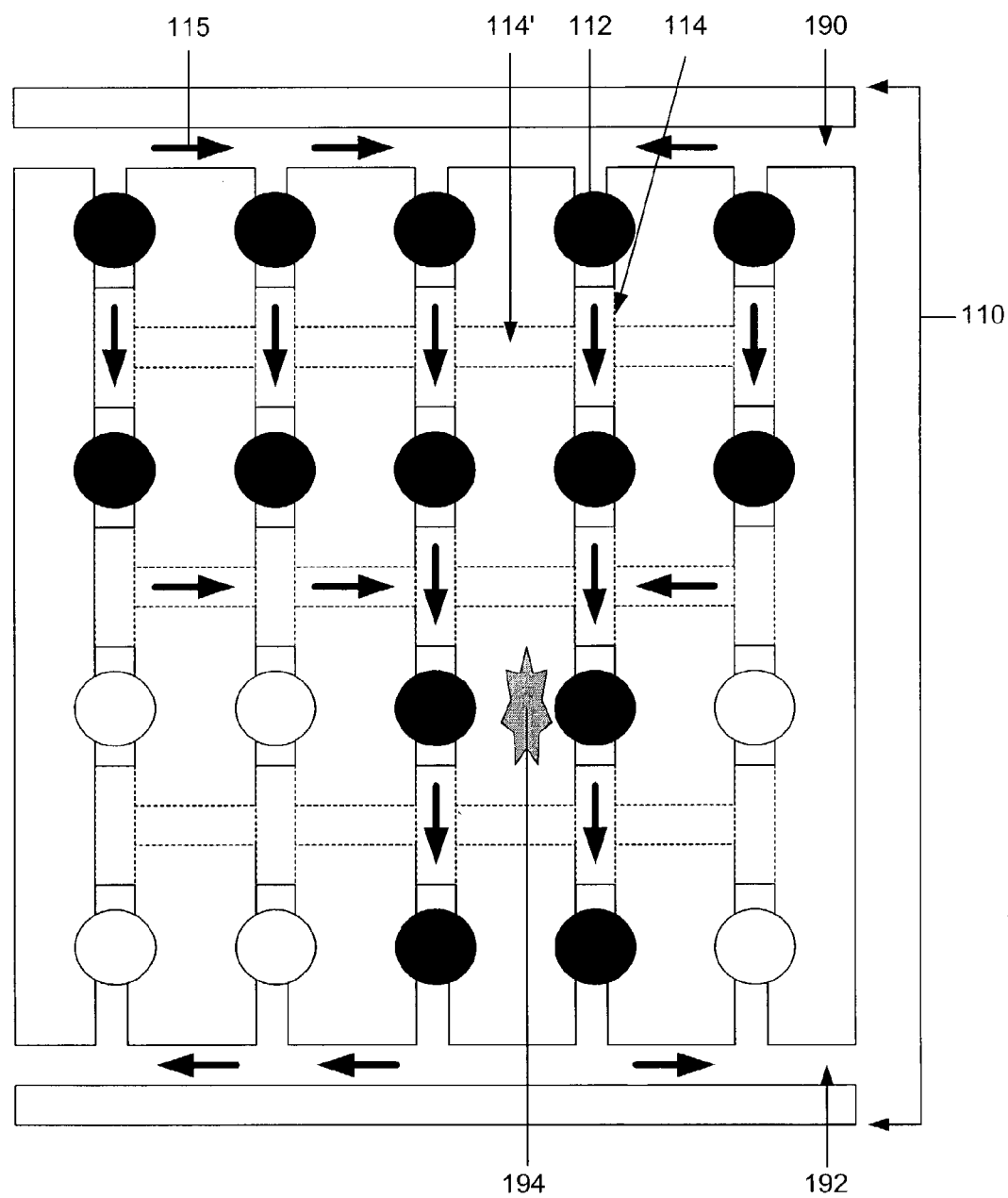
FIG. 4 is a top-down diagram of a system illustrating an embodiment in accordance with the disclosed subject matter.

FIG. 4 illustrates an embodiment in which electro-osmotic pumps 112 may be turned on in a more complex pattern than illustrated by FIG. 3. FIG. 4 illustrates that the electro-osmotic pumps may be turned on in both a serial and parallel fashion. It is contemplated that the cross-channel 114' may allow the pumps 112 to achieve a higher flow rate than could be achieved by merely having micro-channels 114. For example, turning on a number of pumps in a first row and turning on lesser number of pumps in a second row, may force a greater volume of fluid through the "on" pumps of second row than would normally be possible. The cross-channel flow, illustrated in FIG. 4, would provide more fluid to the lesser number of on pumps. It is also contemplated that the cross-channels may also be used to allow more directed flow of the fluid. For example, in FIG. 4 the fluid is directed towards the hot spot 194, and only towards the hot spot. It is not directed at regions of the component that do not need, or are deemed not to need, additional cooling. While FIGS. 3 & 4 illustrate a grid layout for micro-channel 114 and electro-osmotic pumps 112, the disclosed subject matter is not limited to any particular layout.

Figure 5:
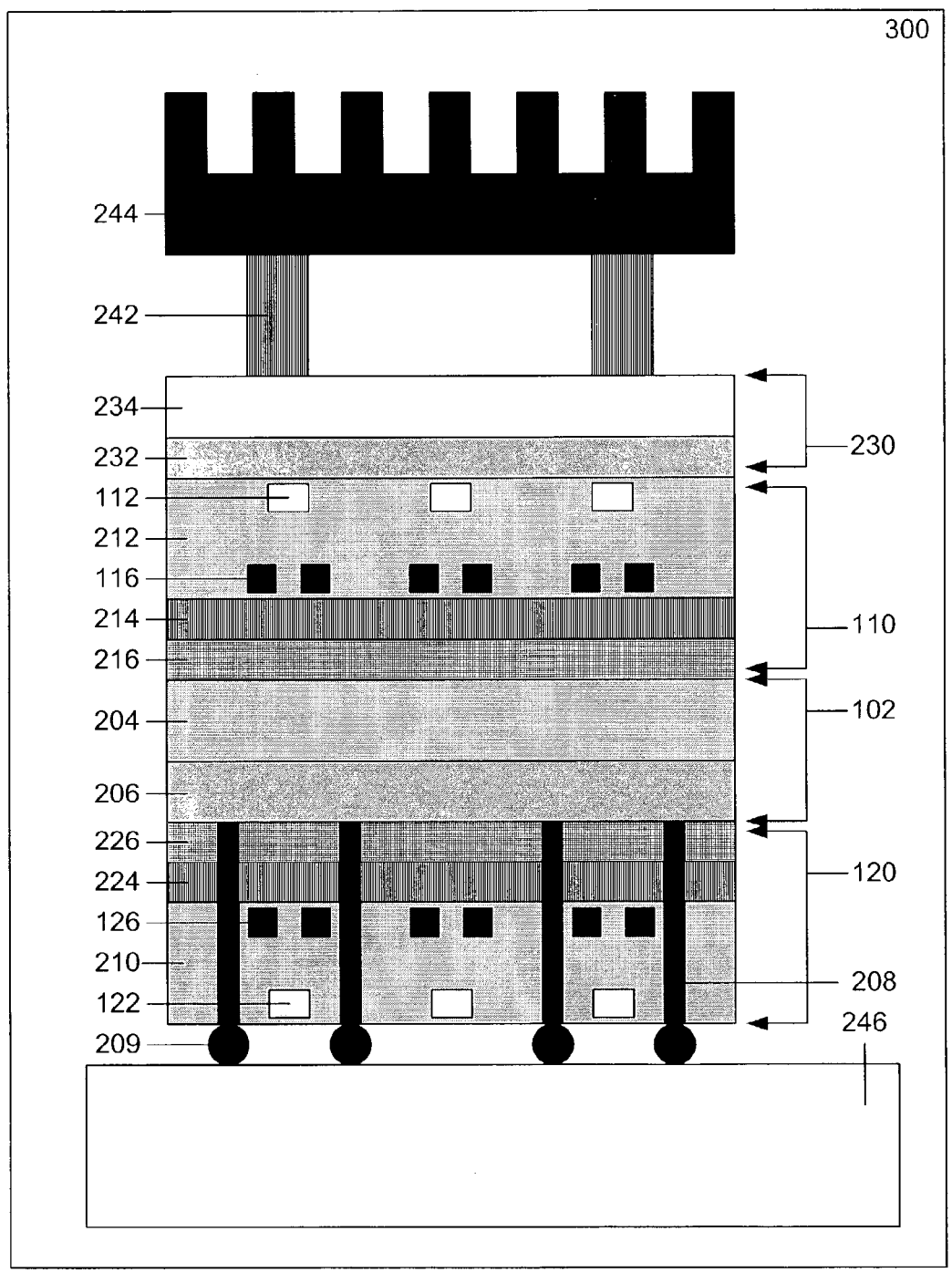
FIG. 5 is a cross sectional diagram of a system illustrating an embodiment in accordance with the disclosed subject matter.

FIG. 5 is a cross sectional diagram of a system 300 illustrating an embodiment in accordance with the disclosed subject matter. In one embodiment, an heat generating layer 102, may be sandwiched between a first and a second cooling layer 110 & 120. The cooling layers may include thermal sensors 116 & 126, electro-osmotic pumps 112 & 122, and micro-channels (not illustrated). In one embodiment, the layers may be arranged as illustrated by FIG. 2; however, other arrangements are contemplated and the disclosed subject matter is not limited to the illustrated arrangement.

In one embodiment, the fluid may undergo an electrochemical reaction when passing through active electro-osmotic pumps. For example, if the fluid is water, the electrical charge of the pumps may turn portions of the fluid into individual hydrogen and oxygen molecules. However, this is merely one illustrative example and other fluids and chemical reactions are contemplated. FIG. 5 illustrates that a re-combiner 230 may be coupled with the cooling layers. The re-combiner may attempt to reverse, at least in part, the electro-chemical reaction induced, in one embodiment, by the electro-osmotic pumps. For example, the re-combiner, such as one comprising platinum or another catalytic material, may re-combine hydrogen and oxygen molecules into water molecules. Again, this is merely one illustrative example and other fluids and chemical reactions are contemplated. In some embodiments, the re-combiner may be utilized to prolong the longevity or usefulness of the fluid. It is also contemplated that the fluid may be in liquid or gaseous form.

The fluid may also pass through a supply line 242. The supply line may carry the fluid between the cooling layers 110 & 120 or re-combiner 230 and a radiator 244, that is external to the microelectronic system. The external radiator may facilitate the radiation of heat outside of the package and/or cool the fluid. It is contemplated that the re-combiner 230, the supply line 242 or the external radiator 244 may comprise a pump, electro-osmotic or mechanical, to facilitate the passage of the fluid within the supply line. In some embodiments, the external radiator 244 may be attached to the package. It is contemplated that the radiator may be coupled remotely with the package. It is also contemplated that the radiator may include a heat sink or heat spreader. It is further contemplated that other techniques may be used to cool fluid and that this is merely one illustrative example.

In one embodiment, the system 300 may include electrical ports 209 to facilitate the transmission of electrical signals between the active electrical devices of heat generating layer 102 and/or electro-osmotic pumps and devices external to the component. The second cooling layer 120 may include a number of vias 208 to allow electrical signals to be transmitted from the active electrical device and the electrical ports, or the electrical connections in the component. In one embodiment, the vias may be on an order of a 25 micrometer diameter on, for example, a 100 micrometer pitch; however, this is merely one illustrative example to which the disclosed subject matter is not limited.

System 300 may also include a build-up layer 246. In one embodiment, the build-up layer may be a Bumpless Build-Up Layer (BBUL) package; however, this is merely one non-limited illustrative example. In another embodiment, the layers of the system may be vertically stacked and bonded utilizing a variety of techniques. As illustrated by FIG. 5, re-combiner 230 may include a layer of re-combiner catalyst 234 and a bonding layer 232. The bonding layer may act as a thermal insulator, such as, for example, a dielectric or polymer. Cooling layers 110 & 120 may include a layer of silicon 210 & 212, and bonding layers 216 & 226. In one embodiment, the bonding layers may be copper metal layers; however, it is contemplated that this is merely one illustrative example and other bonding techniques may be used. In another embodiment, the cooling layers may include an electrical insulator layer 214 & 224, such as, for example glass or a dielectric.

In one embodiment the heat generating layer 102 may include a layer of active electrical devices 206 and a layer of bulk silicon 204. It is contemplated that the heat generating layer 102 and the cooling layers 110 & 120 may be fabricated utilizing separate microelectronic wafer materials, such as for example, silicon or gallium arsenide wafers. These wafers or dies may be bonded to form the above layers. Of course, it is further contemplated that electro-osmotic pumps and micro-channels may be fabricated utilizing different materials created with a variety of fabrication techniques and silicon is merely one example.

Figure 6:
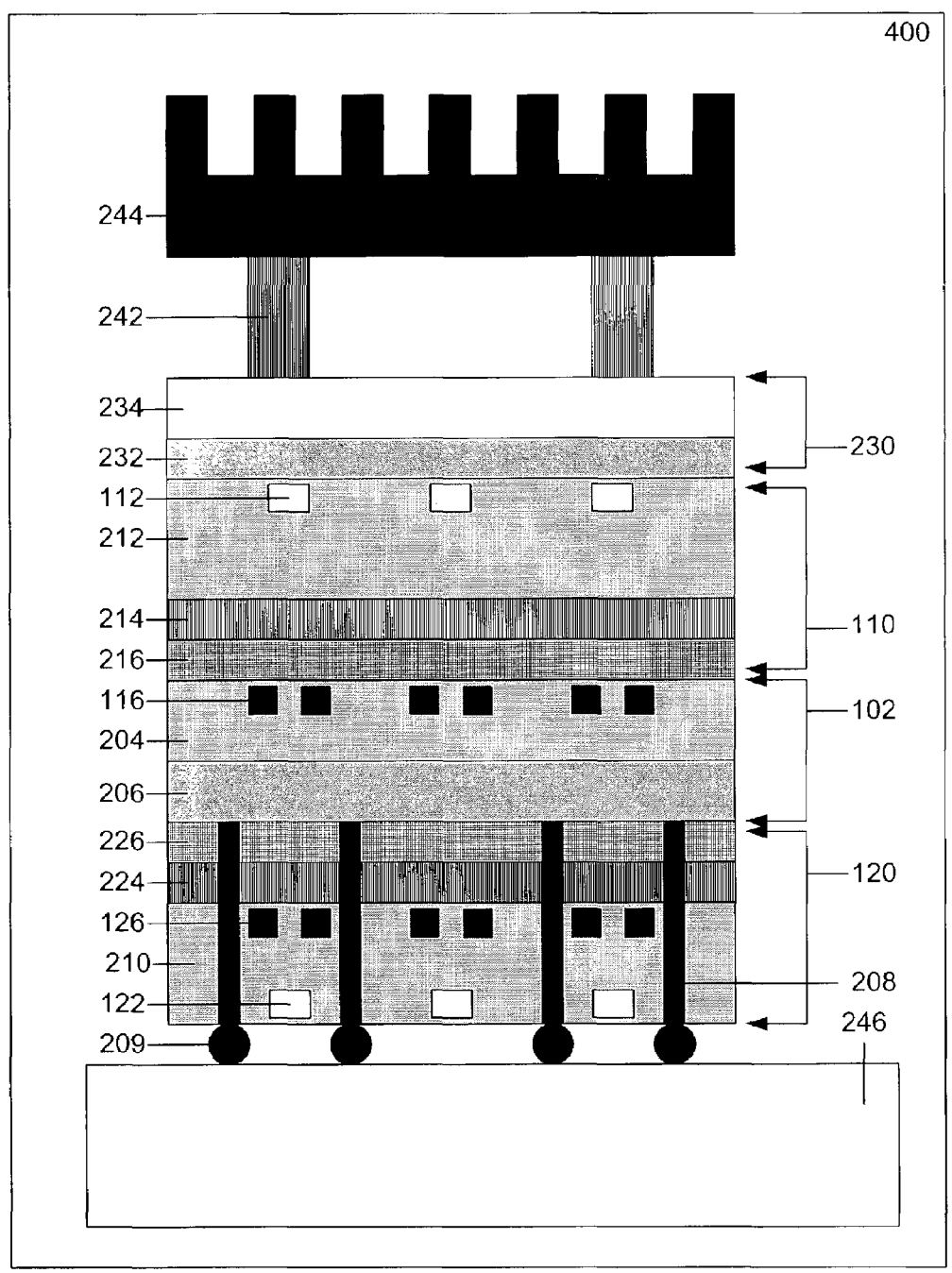
FIG. 6 is a cross sectional diagram of a system illustrating an embodiment in accordance with the disclosed subject matter.

FIG. 6 is a cross sectional diagram of a system 400 illustrating an embodiment in accordance with the disclosed subject matter. In this embodiment, thermal sensors 112 may be placed in the heat generating layer 102. It is contemplated that the thermal sensors may be placed in a variety of places within the system.

Figure 7:
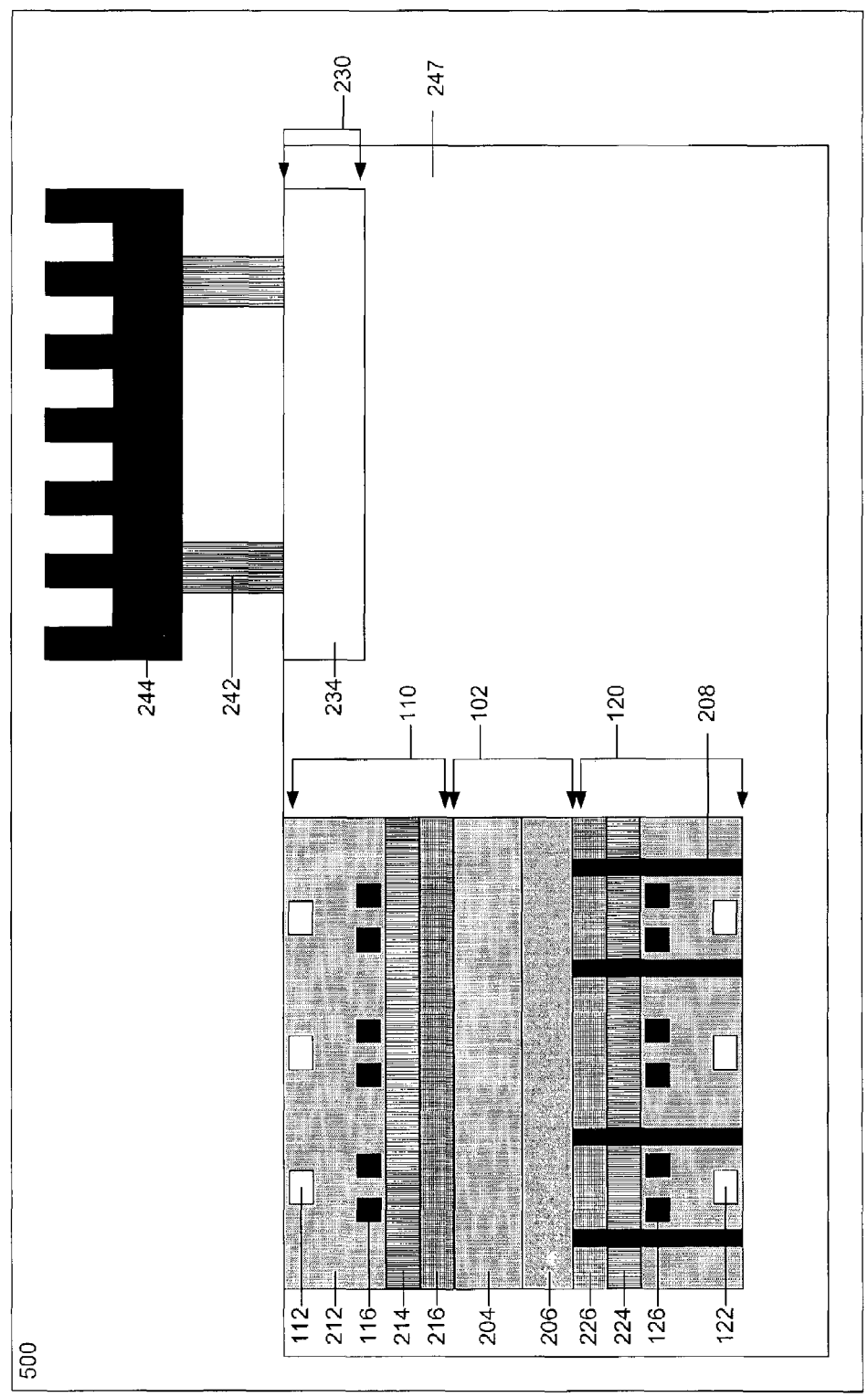
FIG. 7 is a cross sectional diagram of a system illustrating an embodiment in accordance with the disclosed subject matter.

FIG. 7 is a cross sectional diagram of a system 500 illustrating an embodiment in accordance with the disclosed subject matter. System 500 illustrates that the layers of the component may be horizontally or vertically stacked, such as FIGS. 7 & 6, respectively. The heat generating layer 102 and the cooling layers 110 & 120 may be embedded within the container 246. While system 500 is an embodiment where the layers are horizontally stacked, other embodiments may stack the layers vertically.

In one embodiment, the re-combiner 230 may be horizontally offset from the first cooling layer 110. The re-combiner 230 may be coupled with first cooling layer utilizing a micro-channel etched within the container 246. It is contemplated that the individual layers may be coupled utilizing micro-channels etched, or fabricated utilizing another technique. For example, in one embodiment, the first cooling layer 110 may be offset from the heat generating layer 102. Both the first cooling layer, the container, and the heat generating layer may include micro-channels. These micro-channels may be coupled to facilitate the transmission of heat from the active electrical devices to the fluid passing through the micro-channel of the cooling layer.

Figure 8:
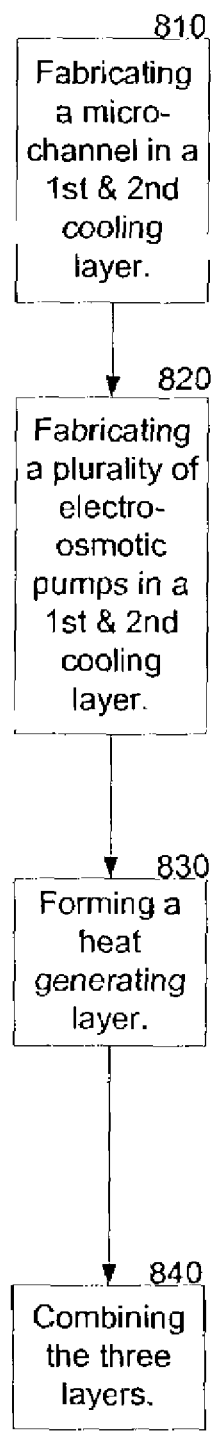
FIG. 8 is a flowchart illustrating an embodiment in accordance with the disclosed subject matter.

FIG. 8 is a flowchart illustrating an embodiment of a technique in accordance with the disclosed subject matter. It is contemplated that a technique may be used to fabricate any of the illustrative example embodiment described above. Such as technique may include the technique illustrated in FIG. 8. Of course, an embodiment of a technique in accordance with the disclosed subject matter may allow the fabrication of apparatus or system embodiments of the disclosed subject matter that were not described above or illustrated by the example embodiments. Block 810 illustrates fabricating a micro-channel or channel in a first and a second cooling layer. Block 820 illustrates fabricating a plurality of electro-osmotic pumps in the first and second cooling layers. Block 830 illustrates forming a heat generating layer. Block 840 illustrates combining the three layers to facilitate the cooling of the heat generating layer. Of course, these blocks may be expanded upon and/or additional blocks may be used.

While certain features of the disclosed subject matter have been illustrated and described herein, many modifications, substitutions, changes, and equivalents will now occur to those skilled in the art. It is, therefore, to be understood that the appended claims are intended to cover all such modifications and changes that fall within the true spirit of the disclosed subject matter.

What is claimed is:

1. An apparatus comprising:
   a first semiconductor wafer including a heat generating layer that includes a plurality of heat generating devices;
   a second semiconductor wafer including a first cooling layer including a microchannel to allow the passage of a fluid through the microchannel and a plurality of electro-osmotic pumps to facilitate the passage of the fluid through the microchannel;
   a third semiconductor wafer including a second cooling layer thermally coupled to said heat generating layer; and a fourth semiconductor wafer including a recombiner fluidically connected to the first and second cooling layers, said first, second, third, and fourth semiconductor wafers being combined in face to face relationship to form an integrated structure.

2. The apparatus of claim 1, wherein the first cooling layer includes an operative layer and a substrate layer; and
the operative layer includes the electro-osmotic pumps, and
the micro-channel runs through both the heat generating layer and the substrate layer.

3. The apparatus of claim 2, wherein the first cooling layer includes at least one thermal sensor to sense the temperature of at least part of the heat generating layer; and
the thermal sensor is capable of providing signals to the electro-osmotic pumps to facilitate controlling the passage of fluid through the micro-channels.

4. The apparatus of claim 1, wherein the plurality of electro-osmotic pumps are capable of being individually turned on and off; and
the plurality of electro-osmotic pumps are capable of substantially controlling the passage of the fluid through the micro-channel.

5. The apparatus of claim 4, wherein the plurality of electro-osmotic pumps are capable of being connected in a plurality of series or parallel combinations.

6. The apparatus of claim 1, wherein the plurality of electro-osmotic pumps are capable of being individually turned on in such a way as to achieve a higher flow rate of the fluid than an individual electro-osmotic pump.

7. The apparatus of claim 6, wherein the micro-channel includes:
a plurality of non-intersecting micro-channels; and
at least one cross-channel to connect at least two of the non-intersecting micro-channels.

8. The apparatus of claim 7, wherein the plurality of electro-osmotic pumps are capable of being individually turned on so that the flow of fluid from a first non-intersecting micro-channels is directed through the cross-channel and into a second non-intersecting micro-channels.

9. The apparatus of claim 7, wherein the plurality of electro-osmotic pumps are capable of regulating the flow of fluid through the at least one cross-channel.

10. The apparatus of claim 1, wherein the heat generating layer has a top and a bottom surface;
the heat generating devices are positioned within the heat generating layer so as to be substantially close to the top surface; and
the first cooling layer is coupled with the bottom surface.

11. The apparatus of claim 10, further including a second cooling layer that is coupled with the top surface of the heat generating layer; and
wherein the first cooling layer is coupled with the bottom surface of the heat generating layer.

12. The apparatus of claim 11, further including a layer of electrical ports to facilitate the transmission of electrical signals between the apparatus and a device external to the apparatus;
wherein the heat generating devices includes a plurality of electrical devices; and wherein the first cooling layer includes:
a top that is coupled with the bottom surface of the heat generating layer;
a bottom that is coupled with the electrical ports; and
a plurality of vias to facilitate the transmission of electrical signals between the electrical devices and the electrical ports.

13. A method of fabricating a microelectronic package comprising:
using a first silicon wafer to form a heat generating layer including a plurality of heat generating devices capable of generating heat;
utilizing a second silicon wafer to form a microchannel to facilitate the passage of a fluid through a first and second cooling layer and to form electro-osmotic pumps to pump said fluid, said first and second electro-osmotic pumps formed in said first and second cooling layers, said first and second cooling layers being thermally coupled to said heat generating layer;
utilizing a third semiconductor wafer to form a recombiner, in fluid communication with said electro-osmotic pumps formed in said first and second cooling layers; and
combining said first, second, and third semiconductor wafers in face to face abutment to form an integrated structure.

14. A method of claim 13, wherein fabricating a plurality of electro-osmotic pumps includes fabricating the electro-osmotic pumps so that the electro-osmotic pumps sufficiently intersect the micro-channel.

15. A method of claim 13, further including combining a re-combiner with the first and second cooling layers to at least in part improve the longevity of the fluid.

16. A method of claim 13, wherein combining includes bonding the layers utilizing wafer bonding techniques.

* * * * *